US012713763B2

(12) United States Patent
Han et al.

(10) Patent No.: US 12,713,763 B2
(45) Date of Patent: Aug. 18, 2026

(54) DISPLAY DEVICE HAVING LIGHT-EMITTING ELEMENTS WITH BICARBONATE-BONDED METAL OXIDE ELECTRON TRANSPORT LAYERS

(71) Applicants: Samsung Display Co., Ltd., Yongin-si (KR); Hongik University Industry-Academia Cooperation Foundation, Seoul (KR)

(72) Inventors: Chang Yeol Han, Yongin-si (KR); Heesun Yang, Seoul (KR); Suk-Young Yoon, Seoul (KR)

(73) Assignees: SAMSUNG DISPLAY CO., LTD., Gyeonggi-Do (KR); HONGIK UNIVERSITY INDUSTRY-ACADEMIA COOPERATION FOUNDATION, Seoul (KR)

(*) Notice: Subject to any disclaimer, the term of this patent is extended or adjusted under 35 U.S.C. 154(b) by 396 days.

(21) Appl. No.: 18/353,507

(22) Filed: Jul. 17, 2023

(65) Prior Publication Data

US 2024/0179936 A1 May 30, 2024

(30) Foreign Application Priority Data

Nov. 24, 2022 (KR) ........................ 10-2022-0159318

(51) Int. Cl.
*H10K 50/16* (2023.01)
*H10K 50/115* (2023.01)
(Continued)

(52) U.S. Cl.
CPC ........... *H10K 50/16* (2023.02); *H10K 50/115* (2023.02); *H10K 59/1201* (2023.02); *H10K 59/35* (2023.02)

(58) Field of Classification Search
CPC ........ H10K 50/16; H10K 71/00; H10K 85/60; H10K 50/115; H10K 2102/00;
(Continued)

(56) References Cited

U.S. PATENT DOCUMENTS 7,700,200 B2 * 4/2010 Bulovi .................. B82Y 20/00 313/506
9,559,327 B2 * 1/2017 Yoneda ................ H10K 50/171
(Continued)

FOREIGN PATENT DOCUMENTS

KR 10-1626525 6/2016
KR 10-1658691 9/2016
(Continued)

OTHER PUBLICATIONS

Song et al., "Over 30% External Quantum Efficiency Light-Emitting Diodes by Engineering Quantum Dot-Assisted Energy Level Match for Hole Transport Layer", Advanced Functional Materials, 2019, pp. 1-9.
(Continued)

*Primary Examiner* — Caleb E Henry
(74) *Attorney, Agent, or Firm* — CANTOR COLBURN LLP

(57) ABSTRACT

Embodiments provide a light emitting element that includes a first electrode, a second electrode disposed on the first electrode, a light emitting layer disposed between the first electrode and the second electrode and including a quantum dot, a hole transport region disposed between the first electrode and the light emitting layer, and an electron transport layer disposed between the light emitting layer and the second electrode, wherein the electron transport layer includes an electron transport material, and the electron transport material includes a metal oxide particle, and a bicarbonate coupled to a surface of the metal oxide particle.

12 Claims, 13 Drawing Sheets

(51) Int. Cl.
*H10K 59/12* (2023.01)
*H10K 59/35* (2023.01)

(58) Field of Classification Search
CPC .. H10K 2102/331; H10K 71/12; H10K 50/15; H10K 50/17; H10K 50/18; C09K 11/883; C09K 11/02; H01L 51/56; H01L 2251/5369; H01L 51/5096; H01L 51/5072; H01L 51/5088; H01L 51/5056; H01L 51/502; H01L 51/0003; H01L 2251/303; H01L 51/508; H01L 51/5004; H01L 51/5036; H01L 2251/558; H01L 51/507
See application file for complete search history.

(56) References Cited

U.S. PATENT DOCUMENTS

| | | | | |
|---|---|---|---|---|
| 9,564,609 | B2 * | 2/2017 | Sasaki | H10K 50/818 |
| 9,577,206 | B2 * | 2/2017 | Yamae | H10K 59/877 |
| 9,647,228 | B2 * | 5/2017 | Seo | H10K 50/19 |
| 9,653,517 | B2 * | 5/2017 | Uesaka | H10K 50/11 |
| 10,522,775 | B2 * | 12/2019 | Tsukamoto | H10K 50/171 |
| 10,826,010 | B1 * | 11/2020 | Montgomery | H10K 50/115 |
| 11,456,433 | B2 | 9/2022 | Park et al. | |
| 11,832,468 | B2 * | 11/2023 | Seo | C09K 11/883 |
| 2002/0189542 | A1 * | 12/2002 | Van Slyke | C23C 14/12 118/712 |
| 2003/0211651 | A1 * | 11/2003 | Krasnov | C09K 11/883 438/102 |
| 2005/0098207 | A1 * | 5/2005 | Matsumoto | H10K 50/155 313/506 |
| 2005/0274944 | A1 * | 12/2005 | Jang | H05B 33/14 438/22 |
| 2008/0264475 | A1 * | 10/2008 | Ito | H01G 9/2004 136/252 |
| 2008/0290797 | A1 * | 11/2008 | Park | B82Y 20/00 313/504 |
| 2009/0039764 | A1 * | 2/2009 | Cho | H05B 33/14 313/504 |
| 2009/0243473 | A1 * | 10/2009 | Iwakuma | H10K 50/11 313/504 |
| 2010/0108984 | A1 * | 5/2010 | Cho | C09K 11/565 257/13 |
| 2012/0032138 | A1 * | 2/2012 | Kim | H10K 50/115 438/46 |
| 2012/0086331 | A1 * | 4/2012 | Kobayashi | H10K 50/13 313/504 |
| 2012/0138894 | A1 * | 6/2012 | Qian | H10K 50/115 257/E33.012 |
| 2013/0277669 | A1 * | 10/2013 | Krebs | H10K 30/30 427/126.3 |
| 2014/0014896 | A1 * | 1/2014 | Chung | H10K 50/16 438/47 |
| 2015/0076469 | A1 * | 3/2015 | Ikemizu | H10K 50/11 257/40 |
| 2015/0076494 | A1 * | 3/2015 | Pickett | H01L 21/02601 257/43 |
| 2016/0150619 | A1 * | 5/2016 | Krummacher | H10K 50/88 315/224 |
| 2016/0233449 | A1 * | 8/2016 | Murayama | C09K 11/565 |
| 2017/0012231 | A1 * | 1/2017 | Mishima | H10K 50/11 |
| 2017/0271605 | A1 * | 9/2017 | Steckel | C09K 11/025 |
| 2018/0062101 | A1 * | 3/2018 | Li | H10K 50/115 |
| 2018/0179441 | A1 * | 6/2018 | Park | G02B 5/22 |
| 2018/0254421 | A1 * | 9/2018 | Kinge | H10K 50/15 |
| 2019/0157596 | A1 * | 5/2019 | Kim | H10K 50/115 |
| 2020/0028105 | A1 * | 1/2020 | Seo | C09K 11/883 |
| 2020/0266348 | A1 * | 8/2020 | Kim | C09K 11/883 |
| 2020/0321490 | A1 * | 10/2020 | Yang | H10K 50/115 |
| 2020/0321546 | A1 * | 10/2020 | He | H10K 50/115 |
| 2020/0328380 | A1 * | 10/2020 | Benzie | H10K 50/85 |
| 2020/0411719 | A1 * | 12/2020 | Kimoto | H10K 50/165 |
| 2021/0074939 | A1 * | 3/2021 | Jung | H10K 59/38 |
| 2021/0371738 | A1 * | 12/2021 | Lee | C09K 11/06 |
| 2021/0395611 | A1 * | 12/2021 | Kim | C09K 11/02 |
| 2022/0006036 | A1 * | 1/2022 | Seo | H10K 85/60 |
| 2022/0216441 | A1 * | 7/2022 | Jung | H10K 50/15 |
| 2023/0016588 | A1 * | 1/2023 | Park | H10K 85/342 |

FOREIGN PATENT DOCUMENTS

| | | |
|---|---|---|
| KR | 20200120826 A | 10/2020 |
| KR | 10-2181060 | 11/2020 |
| KR | 10-2224916 | 3/2021 |
| KR | 10-2021-0156731 | 12/2021 |
| KR | 10-2022-0003356 | 1/2022 |

OTHER PUBLICATIONS

Qian et al., "Stable and efficient quantum-dot light-emitting diodes based on solution-processed multilayer structures", nature photonics, Sep. 2011, pp. 543-548, vol. 5.

Dai et al., "Solution-processed, high-performance light-emitting diodes based on quantum dots", Nature, Oct. 29, 2014, pp. 1-15.

Zhang et al., "ZnMgO:PVP inorganic-organic hybrid electron transport layer: Towards efficient bottom-emission and transparent quantum dot light-emitting diodes", Journal of Materials Chemistry C, Jan. 23, 2019, 20 total pages.

Han et al., "More Than 9% Efficient ZnSeTe Quantum Dot-Based Blue Electroluminescent Devices", ACS Energy Letters, Apr. 14, 2020, pp. 1568-1576. vol 5.

Chen et al., "Chloride-Passivated Mg Doped ZnO Nanoparticles For Improving Performance of Cadimum-Free Quantum-Dot Light-Emitting Diodes", ACS photonics, Jul. 6, 2018, 26 total pages.

* cited by examiner

DISPLAY DEVICE HAVING LIGHT-EMITTING ELEMENTS WITH BICARBONATE-BONDED METAL OXIDE ELECTRON TRANSPORT LAYERS

CROSS-REFERENCE TO RELATED APPLICATION(S)

This application claims priority to and benefits of Korean Patent Application No. 10-2022-0159318 under 35 U.S.C. § 119, filed on Nov. 24, 2022, in the Korean Intellectual Property Office, the entire contents of which are incorporated herein by reference.

BACKGROUND

1. Technical Field

The disclosure relates to a light emitting element, a display device including the light emitting element, and a method for manufacturing the light emitting element.

2. Description of the Related Art

Various display devices used for multimedia devices such as a television, a mobile phone, a tablet computer, a navigation system, and a game machine are being developed. In such a display device, a so-called self-luminescent display element is used, which achieves display by emitting light from a light emitting material that includes an organic compound.

In order to improve color reproducibility of the display device, the development of a light emitting element using quantum dots as a light emitting material is underway, which requires improvements in luminescence efficiency and lifespan of the light emitting element using quantum dots.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element with improved light emitting efficiency, and a display device including the same.

The disclosure also provides a method for manufacturing a light emitting element with improved light emitting efficiency.

An embodiment provides a light emitting element which may include: a first electrode; a second electrode disposed on the first electrode; a light emitting layer disposed between the first electrode and the second electrode, and including a quantum dot; a hole transport region disposed between the first electrode and the light emitting layer; and an electron transport layer disposed between the light emitting layer and the second electrode, wherein the electron transport layer may include an electron transport material, and the electron transport material may include a metal oxide particle, and a bicarbonate coupled to a surface of the metal oxide particle.

In an embodiment, the electron transport material may include about 10 mol % to about 20 mol % of the bicarbonate, based on a total number of moles of the metal oxide particle.

In an embodiment, the metal oxide particle may be represented by Formula 1.

$$Zn_{(1-x)}Me_xO \quad \text{[Formula 1]}$$

In Formula 1, $0 \leq x \leq 0.5$, and Me may include at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba.

In an embodiment, the electron transport layer may be directly disposed on the light emitting layer.

In an embodiment, the quantum dot may not include cadmium.

In an embodiment, the electron transport region may include a hole injection layer, and a hole transport layer disposed between the hole injection layer and the light emitting layer.

An embodiment provides a display device including light emitting elements, wherein each of the light emitting elements may include: a first electrode; a second electrode disposed on the first electrode; a light emitting layer disposed between the first electrode and the second electrode, and including a quantum dot; a hole transport region disposed between the first electrode and the light emitting layer; and an electron transport layer disposed between the light emitting layer and the second electrode, wherein the electron transport layer may include an electron transport material, and the electron transport material may include a metal oxide particle, and a bicarbonate coupled to a surface of the metal oxide particle.

In an embodiment, the quantum dot may include a first quantum dot emitting first color light, a second quantum dot emitting second color light which has a wavelength longer than that of the first color light, and a third quantum dot emitting third color light which has a wavelength longer than that of the second color light, and the light emitting elements may include a first light emitting element including the first quantum dot, a second light emitting element including the second quantum dot, and a third light emitting element including the third quantum dot.

In an embodiment, the average diameter of the first to third quantum dots may satisfy Equation 1.

$$\text{average diameter of first quantum dot} < \text{average diameter of second quantum dot} < \text{average diameter of third quantum dot.} \quad \text{[Equation 1]}$$

In an embodiment, the electron transport material may include about 10 mol % to about 20 mol % of the bicarbonate, based on a total number of moles of the metal oxide particle.

In an embodiment, the metal oxide particle may be represented by Formula 1.

$$Zn_{(1-x)}Me_xO \quad \text{[Formula 1]}$$

In Formula 1, 05x≤0.5, and Me may include at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba.

In an embodiment, the electron transport layer may be directly disposed on the light emitting layer.

In an embodiment, the quantum dot may not include cadmium.

In an embodiment, the electron transport region may include a hole injection layer, and a hole transport layer disposed between the hole injection layer and the light emitting layer.

An embodiment provides a method for manufacturing a light emitting element which may include: providing a first electrode; forming a hole transport region on the first electrode; forming a light emitting layer including a quantum dot on the hole transport region; applying an electron transport material on the light emitting layer to form an electron transport layer; and forming a second electrode on the electron transport layer, wherein the electron transport layer may include an electron transport material, and the electron transport material may include a metal oxide particle, and a bicarbonate coupled to a surface of the metal oxide particle.

In an embodiment, the metal oxide particle may be represented by Formula 1.

$$Zn_{(1-x)}Me_xO \quad \text{[Formula 1]}$$

In Formula 1, $0 \le x \le 0.5$, and Me may include at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba.

In an embodiment, the forming of the electron transport layer may include mixing a metallic compound including the bicarbonate, and the metal oxide particle to form the electron transport material.

In an embodiment, the metallic compound may include at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba.

In an embodiment, the quantum dot may not include cadmium.

In an embodiment, the electron transport region may include a hole injection layer, and a hole transport layer disposed between the hole injection layer and the light emitting layer.

It is to be understood that the embodiments above are described in a generic and explanatory sense only and not for the purpose of limitation, and the disclosure is not limited to the embodiments described above.

BRIEF DESCRIPTION OF THE DRAWINGS

The accompanying drawings are included to provide a further understanding of embodiments, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
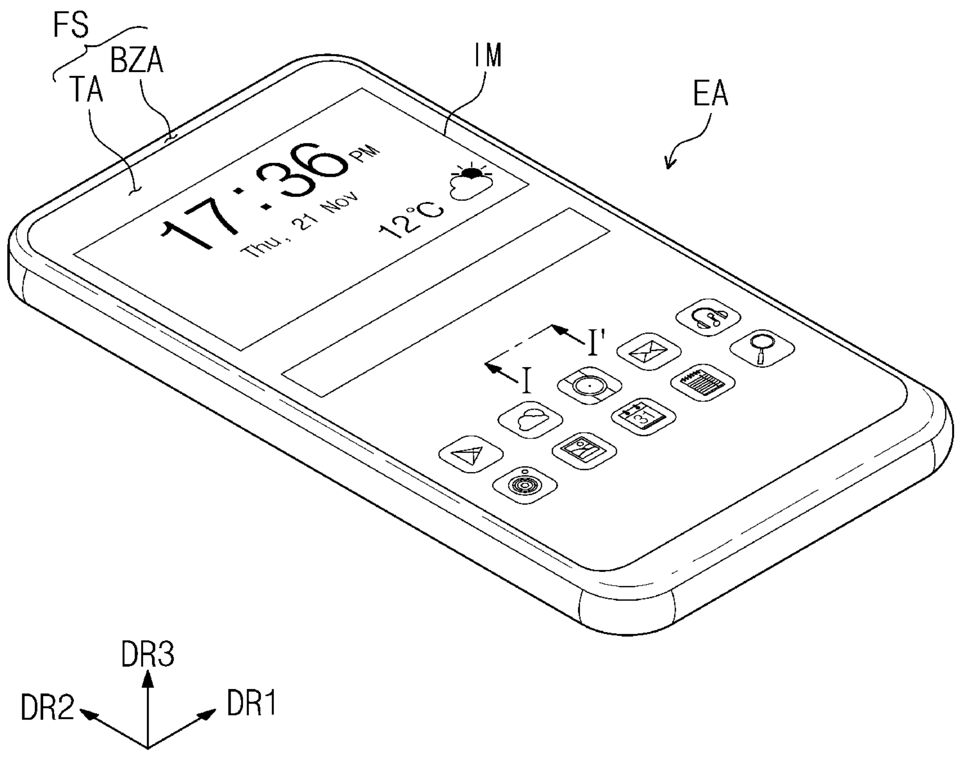
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like reference numbers and/or like reference characters refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may refer to a physical, electrical and/or fluid connection or coupling, with or without intervening elements.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, with reference to the drawings, a light emitting element according to an embodiment, and a display device including the same will be described.

Figure 2:
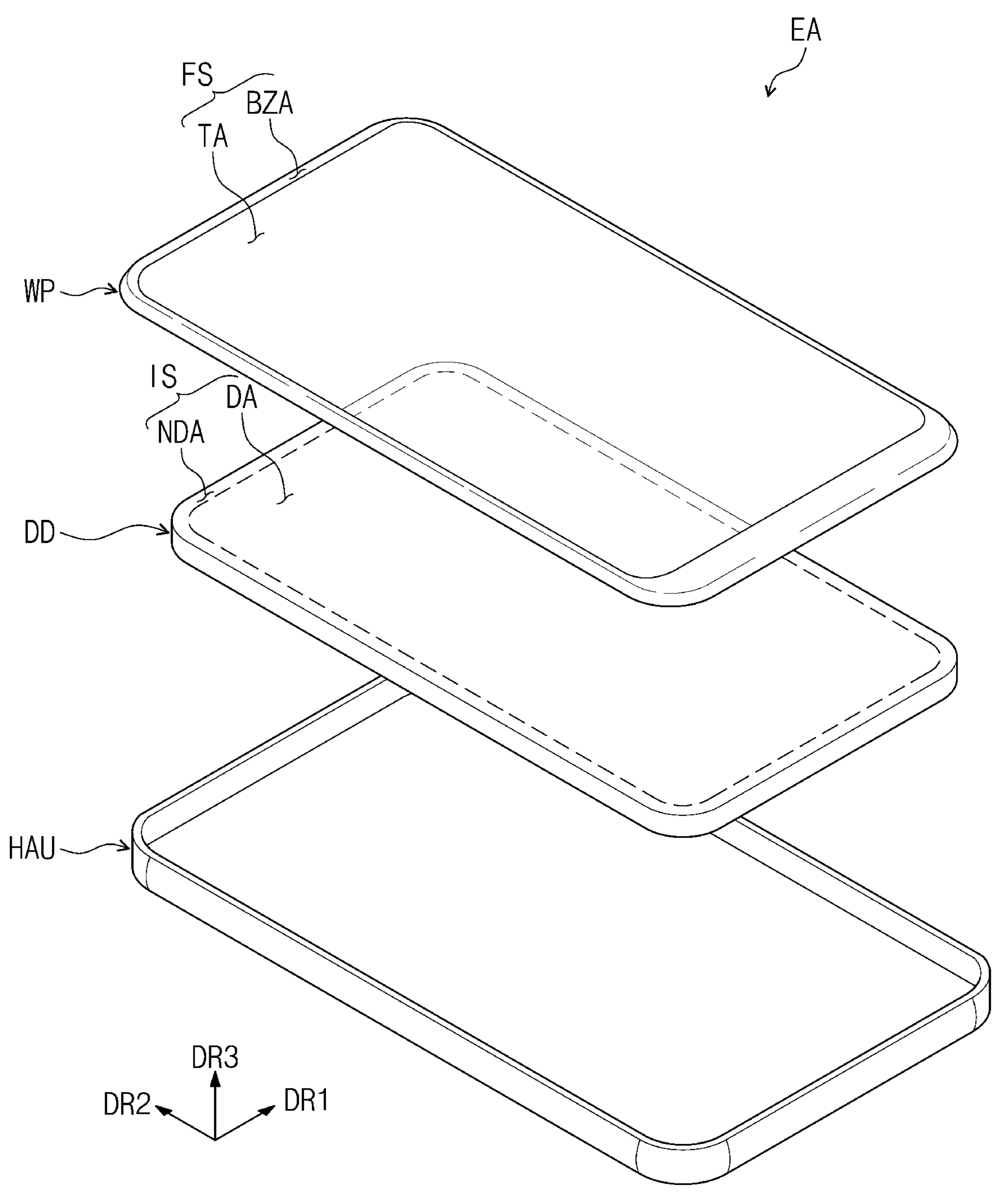
FIG. 2 is an exploded schematic perspective view of a display device according to an embodiment.
Figure 3:
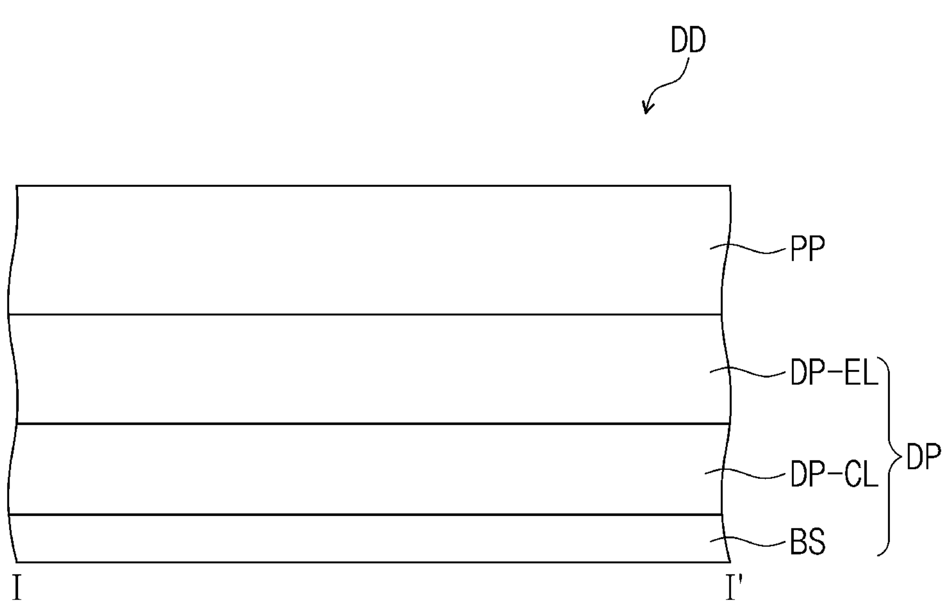
FIG. 3 is a schematic cross-sectional view of a portion of a display device according to an embodiment.
Figure 4A:
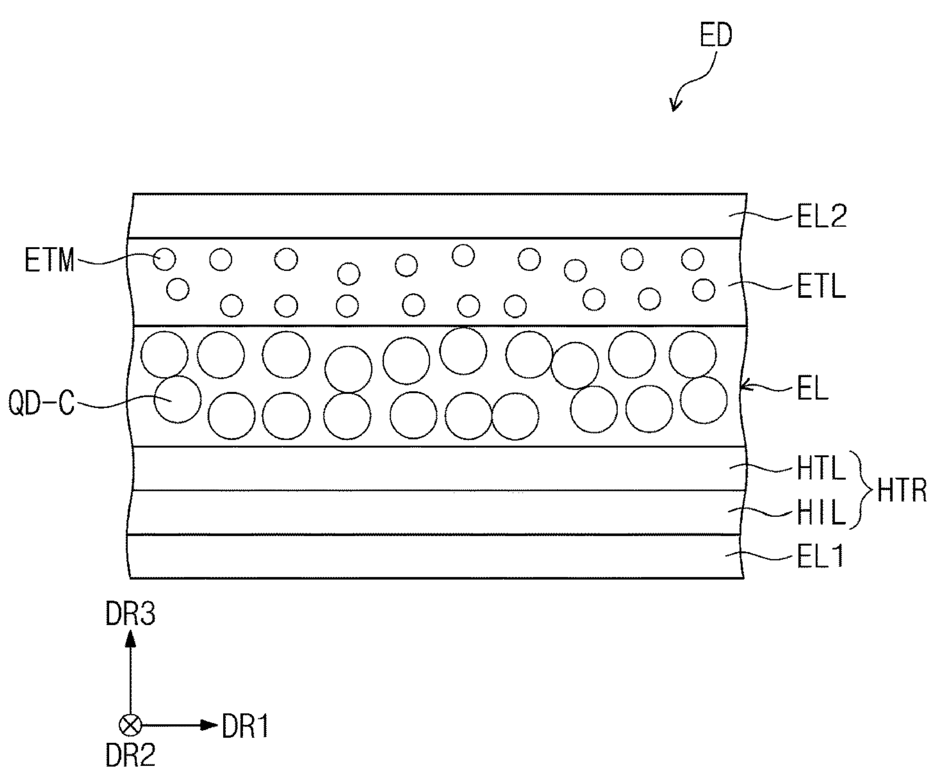
FIG. 4A is a schematic cross-sectional view of a light emitting element according to an embodiment.
Figure 4B:
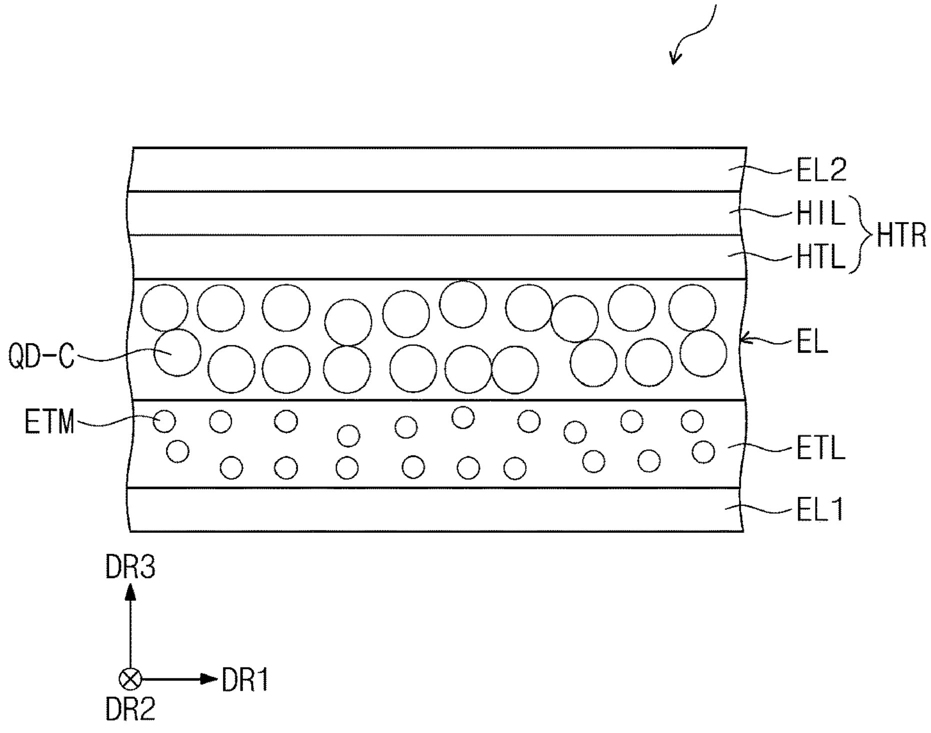
FIG. 4B is a schematic cross-sectional view of a light emitting element according to an embodiment.

FIG. 1 is a schematic perspective view of an electronic device according to an embodiment. FIG. 2 is an exploded schematic perspective view of an electronic device according to an embodiment. FIG. 3 is a schematic cross-sectional view of a portion of a display device according to an embodiment and corresponding to line I-I' illustrated in FIG. 1. FIG. 4A is a schematic cross-sectional view of a light emitting element according to an embodiment. FIG. 4B is a schematic cross-sectional view of a light emitting element according to an embodiment.

Referring to FIG. 1, in an embodiment, an electronic device EA may be a smart phone. However, this is only an example, and embodiments are not limited thereto. For example, the electronic device EA may be a large electronic device such as a television, a monitor, or an external advertisement board. The electronic device EA may be a small- and/or a medium-sized electronic device such as a personal computer, a notebook computer, a personal digital terminal, a car navigation system unit, a game machine, a smart phone, a tablet, and a camera. It should be understood that these are merely examples, and other electronic devices may be implemented within the scope of the embodiments.

The electronic device EA may include a display device DD and a housing HAU. The display device DD may display an image IM through a display surface IS. In FIG. 2, the display surface IS is illustrated as being parallel to a plane defined by a first direction DR1 and a second direction DR2 crossing the first direction DR1. However, this is only an example. In another embodiment, the display surface IS of the display device DD may have a curved shape.

A normal direction to the display surface IS that is a direction in which the image IM is displayed in a thickness direction of the display device DD may be indicated by a third direction DR3. A front surface (or an upper surface) and a rear surface (or a lower surface) of each member may be distinguished by the third direction DR3.

A fourth direction DR4 (see FIG. 7) may be a direction between the first direction DR1 and the second direction DR2. The fourth direction DR4 may be positioned on a plane parallel to the plane defined by the first direction DR1 and the second direction DR2. Directions indicated by the first to fourth directions DR1, DR2, DR3, and DR4 are a relative concept, and may be converted into other directions.

In the electronic device EA, the display surface FS on which the image IM is displayed may correspond to a front surface of the display device DD, and may correspond to a front surface FS of a window WP. Hereinafter, the same reference characters will be used for the display surface and the front surface of the electronic device EA, and for the front surface of the window WP. The image IM may include a moving image as well as a still image. Although not illustrated in the drawings, the electronic device EA may include a foldable display device which includes a folding region and a non-folding region, a bendable display device which includes at least one bending portion, or the like.

A housing HAU may receive the display device DD. The housing HAU may be disposed to cover the display device DD such that an upper surface of the display device DD, which is the display surface IS, is exposed. The housing HAU covers a side surface and a bottom surface of the display device DD, and may expose the entire upper surface thereof. However, embodiments are not limited thereto, and the housing HAU may cover not only the side surface and the bottom surface of the display device DD, but also a portion of the upper surface thereof.

In the electronic device EA according to an embodiment, the window WP may include an optically transparent insulation material. The window WP may include a transmission region TA and a bezel region BZA. The front surface FS of the window WP including the transmission region TA and the bezel region BZA corresponds to the front surface FS of the electronic device EA. A user may visually recognize an image provided through the transmission region TA corresponding to the front surface FS of the electronic device EA.

In FIG. 1 and FIG. 2, the transmission region TA is illustrated as a quadrangular shape having rounded vertices. However, this is only an example, and the transmission region TA may have various shapes, and is not limited to any one embodiment.

The transmission region TA may be an optically transparent region. The bezel region BZA may be a region having relatively low light transmittance compared to the transmission region TA. The bezel region BZA may have a color (e.g., a predetermined or a selectable color). The bezel region BZA is adjacent to the transmission region TA, and may surround the transmission region TA. The bezel region BZA may define the shape of the transmission region TA. However, the embodiment is not limited to what is illustrated. For example, the bezel region BZA may be disposed adjacent to only one side of the transmission region TA, or a portion of the bezel region BZA may be omitted.

The display device DD may be disposed below the window WP. In the specification, the term "below" may also mean a direction opposite to a direction in which the display device DD provides an image.

In an embodiment, the display device DD may be a component that generates the image IM. The image IM generated by the display device DD may be displayed on the display surface IS, and is visually recognized by a user from the outside through the transmission region TA. The display panel DD may include a display region DA and a non-display region NDA. The display region DA may be a region activated according to an electrical signal. The non-display region NDA may be a region covered by the bezel region BZA. The non-display region NDA may be adjacent to the display region DA. The non-display region NDA may surround the display region DA.

The display device DD may include a display panel DP and a light control layer PP disposed on the display panel DP. The display panel DP may include a display element layer DP-EL. The display element layer DP-EL may include a light emitting element ED.

Figure 8:
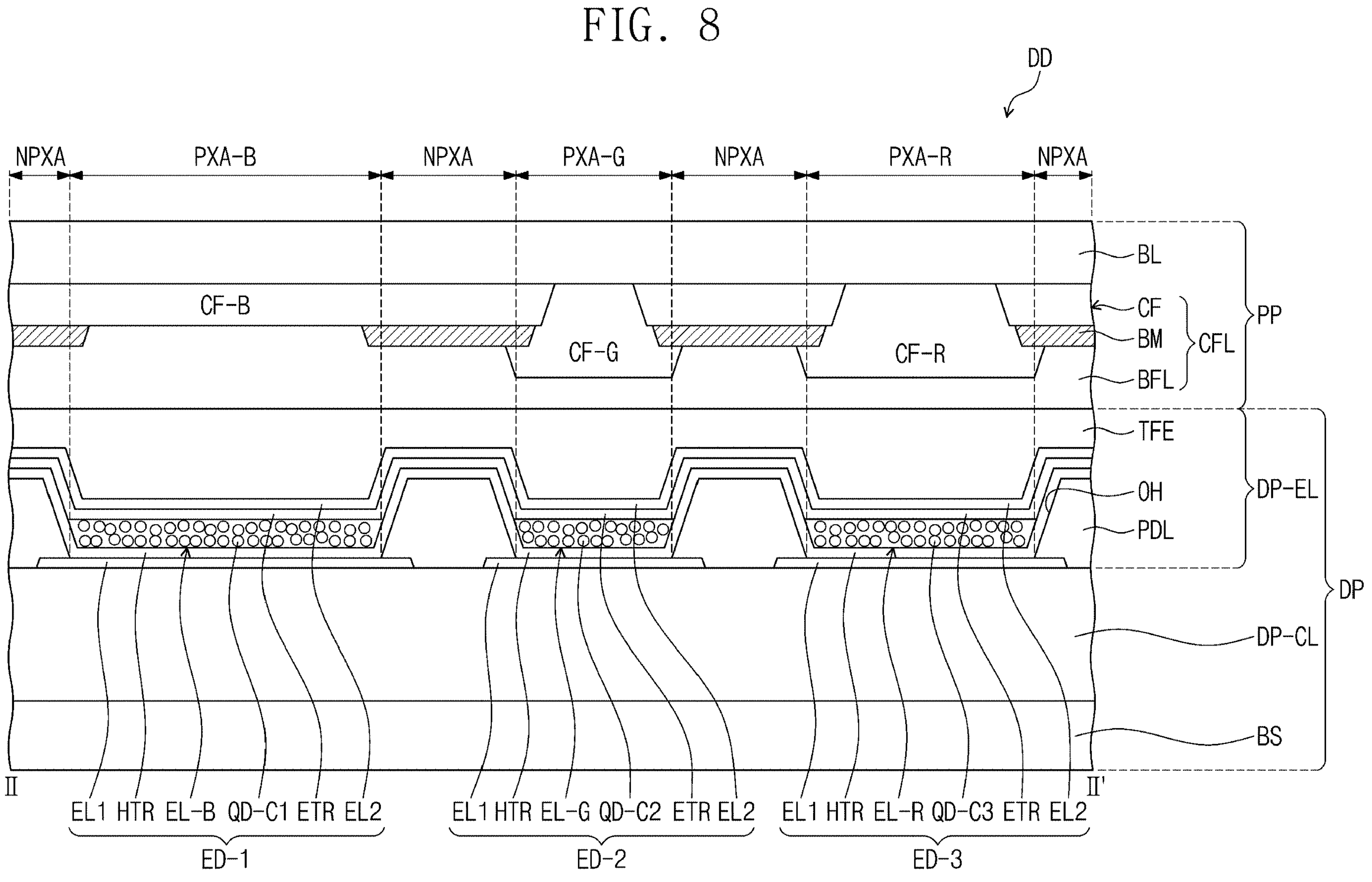
FIG. 8 is a schematic cross-sectional view of a display device according to an embodiment.

The display device DD may include light emitting elements ED-1, ED-2, and ED-3 (see FIG. 8). The light control layer PP may be disposed on the display panel DP to control light that is reflected at the display panel DP from an external light. The light control layer PP may include, for example, a polarizing layer or a color filter layer.

In the display device DD according to an embodiment, the display panel DP may be a light emitting display panel. For example, the display panel DP may be a quantum-dot light emitting display panel including a quantum dot light emitting element. However, embodiments are not limited thereto.

The display panel DP may include a base substrate BS, a circuit layer DP-CL disposed on the base substrate BS, and the display element layer DP-EL disposed on the circuit layer DP-CL.

The base substrate BS may provide a base surface on which the display device layer DP-EL is disposed. The base substrate BS may be a glass substrate, a metal substrate, a plastic substrate, or the like. However, embodiments are not limited thereto, and the base substrate BS may include an inorganic layer, an organic layer, or a composite material layer. The base substrate BS may be a flexible substrate which may be readily bent or folded.

In an embodiment, the circuit layer DP-CL may be disposed on the base substrate BS, and the circuit layer DP-CL may include transistors (not shown). Each of the transistors (not shown) may include a control electrode, an input electrode, and an output electrode. For example, the circuit layer DP-CL may include a switching transistor and a driving transistor for driving the light emitting element ED of the display element layer DP-EL.

FIG. 4A is a schematic cross-sectional view of a light emitting element ED according to an embodiment. Referring to FIG. 4A, the light emitting element ED according to an embodiment may include a first electrode EL1, a second electrode EL2 facing the first electrode EL1, and functional layers disposed between the first electrode EL1 and the second electrode EL2 which may include a light emitting layer EL disposed between the first electrode EL1 and the second electrode EL2.

The functional layers may further include a hole transport region HTR disposed between the first electrode EL1 and the light emitting layer EL, and an electron transport layer ETL disposed between the light emitting layer EL and the second electrode EL2. FIG. 4A illustrates that the hole transport region HTR is disposed between the first electrode EL1 and the light emitting layer EL and that the electron transport layer ETL is disposed between the light emitting layer EL and the second electrode EL2, but embodiments are not limited thereto. For example, as illustrated in FIG. 4B, a light emitting element ED-a according to an embodiment may have a structure in which the electron transport layer ETL is disposed between the first electrode EL1 and the light emitting layer EL, and the hole transport region HTR is disposed between the light emitting layer EL and the second electrode EL2. Hereinafter, a description will be given based on the light emitting element ED illustrated in FIG. 4A, and the description on the light emitting element ED illustrated in FIG. 4A may be equally applied to the light emitting element ED-a illustrated in FIG. 4B except for positions at which the electron transport layer ETL and the hole transport region HTR are respectively disposed.

Although not shown in the drawings, in an embodiment, a capping layer (not shown) may be further disposed on the second electrode EL2.

The light emitting element ED according to an embodiment may include the electron transport layer ETL in the form of a single layer. In an embodiment, the electron transport layer ETL may be directly disposed on the light emitting layer EL. However, this is only an example, and embodiments are not limited thereto. For example, the light emitting element ED according to an embodiment may include the electron transport layer ETL including electron transport sublayers.

The light emitting element ED according to an embodiment may further include electron transport functional layers between the electron transport layer ETL and the second electrode EL2 or between the light emitting layer EL and the electron transport layer ETL. For example, the light emitting element ED according to an embodiment may further include an electron injection layer EIL disposed between the electron transport layer ETL and the second electrode EL2, or may further include a hole blocking layer (not shown) and the like disposed between the electron transport layer ETL and the light emitting layer EL as a functional sublayer. Hereinafter, the light emitting element EL including the electron transport layer ETL as a single layer is described.

In an embodiment, the electron transport layer ETL may include an electron transport material ETM. The electron transport material ETM may include a metallic compound. For example, the electron transport material ETM may include a metal oxide particle, and may have a structure in which a ligand is coupled to a surface of the metal oxide particle. The light emitting element ED according to an embodiment includes the electron transport layer ETL including a metallic compound, and thus, may have excellent electron injection properties. In the specification, the term "electron injection properties" may refer to a degree to which an electron is delivered from the second electrode EL2 to the light emitting layer EL. The electron transport material ETM will be described in detail with reference to FIG. 6 and FIG. 7 below.

The hole transport region HTR may include functional sublayers. For example, the hole transport region HTR may include a hole injection layer HIL and a hole transport layer HTL as functional sublayers. However, embodiments are not limited thereto, and the hole transport region HTR may further include an electron blocking layer (not shown) and the like as functional sublayers.

In the light emitting element ED according to an embodiment, the first electrode EL1 may have conductivity. The first electrode EL1 may be formed of a metal alloy or a conductive compound. The first electrode EL1 may be an anode. The first electrode EL1 may be a pixel electrode.

In the light emitting element ED according to an embodiment, the first electrode EL1 may be a reflective electrode. However, embodiments are not limited thereto. For example, the first electrode EL1 may be a transmissive electrode, a transflective electrode, or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (for example, a mixture of Ag and Mg). In another embodiment, the first electrode EL1 may have a multi-layered structure including a reflective film or a transflective film, each formed of the above materials, and a transparent conductive film formed of indium tin oxide (ITO), indium zinc oxide (IZO), zinc oxide (ZnO), indium tin zinc oxide (ITZO), or the like. For example, the first electrode EL1 may be a multi-layered metal film or may have a structure in which metal films of ITO/Ag/ITO are stacked.

The first electrode EL1 may be an anode. However, this is only an example, and embodiments are not limited thereto. For example, when the second electrode EL2 is an anode, the first electrode EL1 may be a cathode.

The hole transport region HTR may be provided on the first electrode EL1. The hole transport region HTR may include a hole injection layer HIL, a hole transport layer HTL, and the like. The hole transport region HTR may further include at least one of a hole buffer layer (not shown) and an electron blocking layer (not shown), in addition to the hole injection layer HIL and the hole transport layer HTL. The hole buffer layer (not shown) may increase light emission efficiency by compensating for a resonance distance according to a wavelength of light emitted from the light emitting layer EL. Materials which may be included in the hole transport region HTR may be used as a material included in the hole buffer layer. The electron blocking layer (not shown) may be a layer that prevents electron injection from the electron transport region ETR to the hole transport region HTR.

The hole transport region HTR may be a structure having a layer consisting of a single material, a structure having a layer including different materials, or a structure including multiple layers including different materials. For example, the hole transport region HTR may be a structure having a layer including different materials, or may have a structure of the hole injection layer HIL/the hole transport layer HTL, the hole injection layer HIL/the hole transport layer HTL/the hole buffer layer (not shown), the hole injection layer HIL/the hole buffer layer (not shown), the hole transport layer HTL/the hole buffer layer (not shown), or the hole injection layer HIL/the hole transport layer HTL/the electron blocking layer (not shown), wherein the layers of each structure may be stacked from the first electrode EL1 in its respective stated order, but embodiments are not limited thereto.

The hole transport region HTR may be formed using various methods such as vacuum deposition, spin coating, casting, Langmuir-Blodgett (LB), inkjet printing, laser printing, and laser induced thermal imaging (LITI).

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonic acid PANI/CSA), (Polyaniline)/Poly(4-styrenesulfonate) (PANI/PSS), N,N'-di(naphthalene-1-yl)-N,N'-diplienyl-benzidine (NPD), triphenylamine-containing polyether ketone (TPAPEK), 4-Isopropyl-4'-methyldiphenyliodonium Tetrakis(pentafluorophenyl)borate], dipyrazino [2,3-f: 2',3'-h]quinoxaline-2,3,6,7,10,11-hexacarbonitrile (HAT-CN), and the like.

The hole transport layer HTL may include, for example, a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di (naphthalene-1-yl)-N,N'-diplienyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), and the like.

The light emitting layer EL may be provided on the hole transport region HTR. In the light emitting element ED according to an embodiment, the light emitting layer EL may include a quantum dot QD-C. The quantum dot QD-C included in the light emitting layer EL may emit light.

A core of the quantum dot QD-C included in the light emitting layer EL may not include cadmium. However, this is only an example, and embodiments are not limited thereto. For example, the core of the quantum dot QD-C included in the light emitting layer EL may be selected from a Group II-VI compound, a Group III-VI compound, a Group I—III-VI compound, a Group III-V compound, a Group III—II-V compound, a Group I—IV-VI compound, a Group IV element, a Group IV compound, or any combination thereof.

Examples of a Group II-VI compound may include: a binary compound selected from the group consisting of ZnS, ZnSe, ZnTe, ZnO, HgS, HgSe, HgTe, MgSe, MgS, and a mixture thereof; a ternary compound selected from the group consisting of ZnSeS, ZnSeTe, ZnSTe, HgSeS, HgSeTe, HgSTe, HgZnS, HgZnSe, HgZnTe, MgZnSe, MgZnS, and a mixture thereof; a quaternary compound selected from the group consisting of HgZnTeS, HgZnSeS, HgZnSeTe, and a mixture thereof; or any combination thereof.

Examples of a Group III-VI compound may include: a binary compound such as $In_2S_3$, $In_2Se_3$, and the like; a ternary compound such as $InGaS_3$, $InGaSe_3$, and the like; or any combination thereof.

Examples of a Group I—III-VI compound may include: a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof; a quaternary compound such as $AgInGaS_2$, $CuInGaS_2$, and the like; or any combination thereof.

Examples of a Group III-V compound may include: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. A Group III-V compound may further include a Group II metal. For example, InZnP or the like may be selected as a Group III—II-V compound.

Examples of a Group IV-VI compound may include: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; a quaternary compound selected from the group consisting of SnPbSSe, SnPbSeTe, SnPbSTe, and a mixture thereof. The Group IV element may be selected from the group consisting of Si, Ge, and a mixture thereof; or any combination thereof. Examples of a Group IV compound may include a binary compound selected from the group consisting of SiC, SiGe, or a mixture thereof.

A binary compound, a ternary compound, or a quaternary compound may be present in a particle at a uniform concentration, or may be present in a particle at a partially different concentration distribution. A quantum dot may have a core/shell structure in which one quantum dot surrounds another quantum dot. In case that the quantum dot has a core/shell structure, the binary compound, the ternary compound, or the quaternary compound may have a concentration gradient in which the concentration of a material present in the shell decreases toward the center.

In embodiments, the quantum dot QD-C may have the aforementioned core-shell structure including a core having a nanocrystal and a shell surrounding the core. The shell of the quantum dot QD-C may serve as a protection layer to prevent the chemical deformation of the core so as to maintain semiconductor properties, and/or may serve as a charging layer to impart electrophoresis properties to the quantum dot QD-C. The shell may be a single layer or multiple layers. Examples of the shell may include a metal oxide, a non-metal oxide, a semiconductor compound, or any combination thereof.

Examples of a metal oxide or a non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. However, embodiments are not limited thereto.

Examples of a semiconductor compound may include, for example, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but embodiments not limited thereto.

The quantum dot QD-C may have a full width at half maximum (FWHM-C) of a light emission wavelength spectrum equal to or less than about 45 nm. For example, the quantum dot QD-C may have a FWHM-C equal to or less than about 40 nm. For example, the quantum dot QD-C may have a FWHM-C equal to or less than about 30 nm. Color purity or color reproducibility may be improved when the FWHM-C is in any of the above-described ranges. Light emitted through the quantum dot QD-C may be emitted in all directions, so that wide viewing angle characteristics may be improved.

Although the quantum dot QD-C is not particularly limited to a form of the related art, a quantum dot may have a spherical shape, a pyramidal shape, a multi-arm shape, or a cubic shape, or the quantum dot may be in the form of nanoparticles, nanotubes, nanowires, nanofibers, nanoplate particles, or the like.

The quantum dot QD-C may convert the color of emitted light according to a particle size thereof, and accordingly, the quantum dot QD-C may have various light emission colors such as blue, red, green, and the like.

The second electrode EL2 may be provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (for example, a mixture of Ag and Mg). For example, the second electrode EL2 may include AgMg, AgYb, MgAg, or the like. For example, the second electrode EL2 may have a multi-layered structure including a reflective film or a transflective film, each formed of the above-described materials, and a transparent conductive film formed of indium tin oxide (ITO), indium zinc oxide (IZO), zinc oxide (ZnO), indium tin zinc oxide (ITZO), or the like.

The second electrode EL2 may be a cathode. However, this is only an example, and embodiments are not limited thereto. For example, when the first electrode EL1 is a cathode, the second electrode EL2 may be an anode.

Although not shown in the drawings, the second electrode EL2 may be electrically connected to an auxiliary electrode. When the second electrode EL2 is electrically connected to the auxiliary electrode, the resistance of the second electrode EL2 may be reduced.

Figure 5:
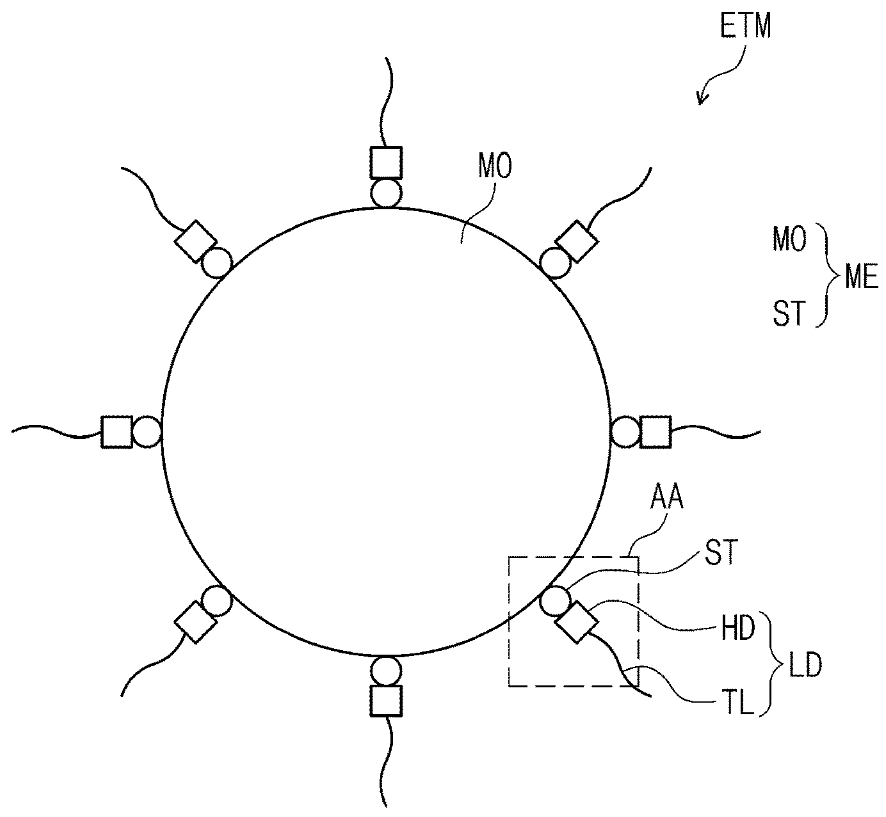
FIG. 5 is a schematic view of an electron transport material according to an embodiment.
Figure 6:
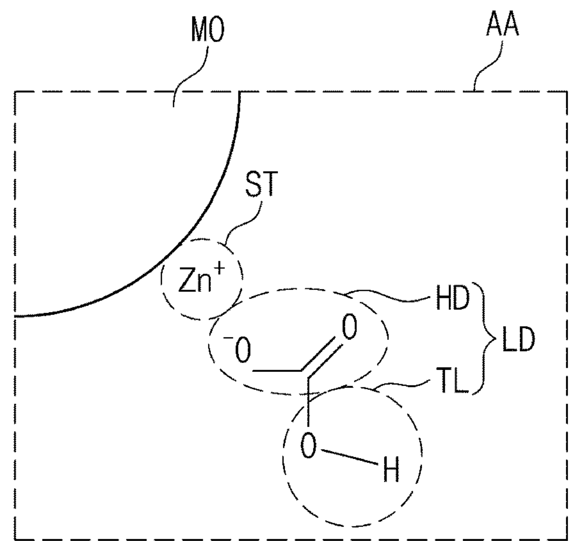
FIG. 6 is a schematic view of an enlarged portion of an electron transport material according to an embodiment.

FIG. 5 is a schematic cross-sectional view of an electron transport material. FIG. 6 is a schematic cross-sectional view of an enlarged portion of an electron transport material. FIG. 6 may show an enlarged portion corresponding to AA of FIG. 5.

Referring FIG. 5 and FIG. 6, in an embodiment, the electron transport material ETM may include a metal oxide particle ME, and a ligand LD. For example, the electron transport material ETM may include the metal oxide particle ME, a surface of which may be coupled with the ligand LD.

The metal oxide particle ME may include a core portion MO, and a coupling portion ST disposed on the surface of the core portion MO. The coupling portion ST may correspond to a defect of the core portion MO that is exposed while being coupled with a cation or an anion. The coupling portion ST may be a portion that is coupled to the ligand LD. The coupling portion ST may be a portion to which an anion or a cation of the ligand LD is coupled.

Although the metal oxide particle ME is illustrated in a circular shape, this is only an example, and the shape of the metal oxide particle ME is not limited thereto. The metal oxide particle ME may be represented by Formula 1.

$$Zn_{(1-x)}Me_xO \quad \text{[Formula 1]}$$

In Formula 1, 0x≤0.5, and Me may include at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba. For example, the ME may be a single metal, or a combination of two or more metals.

The coupling portion ST may be $Zn^+$, or $Me^+$. For example, the coupling portion ST may be a portion having a positive charge. For convenience, although FIG. 6 illustrates that the coupling portion ST is $Zn^+$, embodiments are not limited thereto, and the coupling portion ST may be $Me^+$. When multiple coupling portions ST are provided, all of the coupling portions ST may be $Zn^+$ or all of the coupling portions ST may be Met, or at least one of the coupling portions ST may be $Zn^+$ and the remainder thereof may be $Zn^+$.

The ligand LD may be a bicarbonate. The ligand LD may include a head portion HD and a tail portion TL. The ligand LD may include a negative charge in the head portion HD. For example, in the ligand LD, an oxygen atom in the head portion HD may have a negative charge. Accordingly, in the ligand LD, the head portion HD having the negative charge may be coupled to the coupling portion ST of the metal oxide particle ME having a negative charge. For example, the oxygen atom of the ligand LD may be coupled to $Zn^+$ or Met of the metal oxide particle ME.

The light emitting element ED (see FIGS. 4A and 4B) according to an embodiment may include the electron transport layer ETL (see FIGS. 4A and 4B) including the metal oxide particle ME, the surface of which is coupled with a bicarbonate, so that it is possible to prevent an imbalance in the number of electrons and holes reaching the light emitting layer EL (see FIGS. 4A and 4B). Accordingly, compared to a light emitting element including an electron transport layer which includes only a metal oxide, the light emitting element ED (see FIGS. 4A and 4B) according to an embodiment may exhibit excellent light emitting efficiency.

The electron transport material ETM may include about 10 mol % to about 20 mol % of the bicarbonate, which is the ligand LD, based on a total number of moles of the metal oxide particle ME. When less than about 10 mol % of the bicarbonate, which is the ligand LD, is included based on a total number of moles of the metal oxide particle ME, the effect of increasing light emitting efficiency may be insignificant. When greater than about 20 mol % of the bicarbonate, which is the ligand LD, is included based on a total number of moles of the metal oxide particle ME, the current density may sharply decrease due to the insulation properties of the bicarbonate, so that the light emitting efficiency of the element may be reduced.

Figure 7:
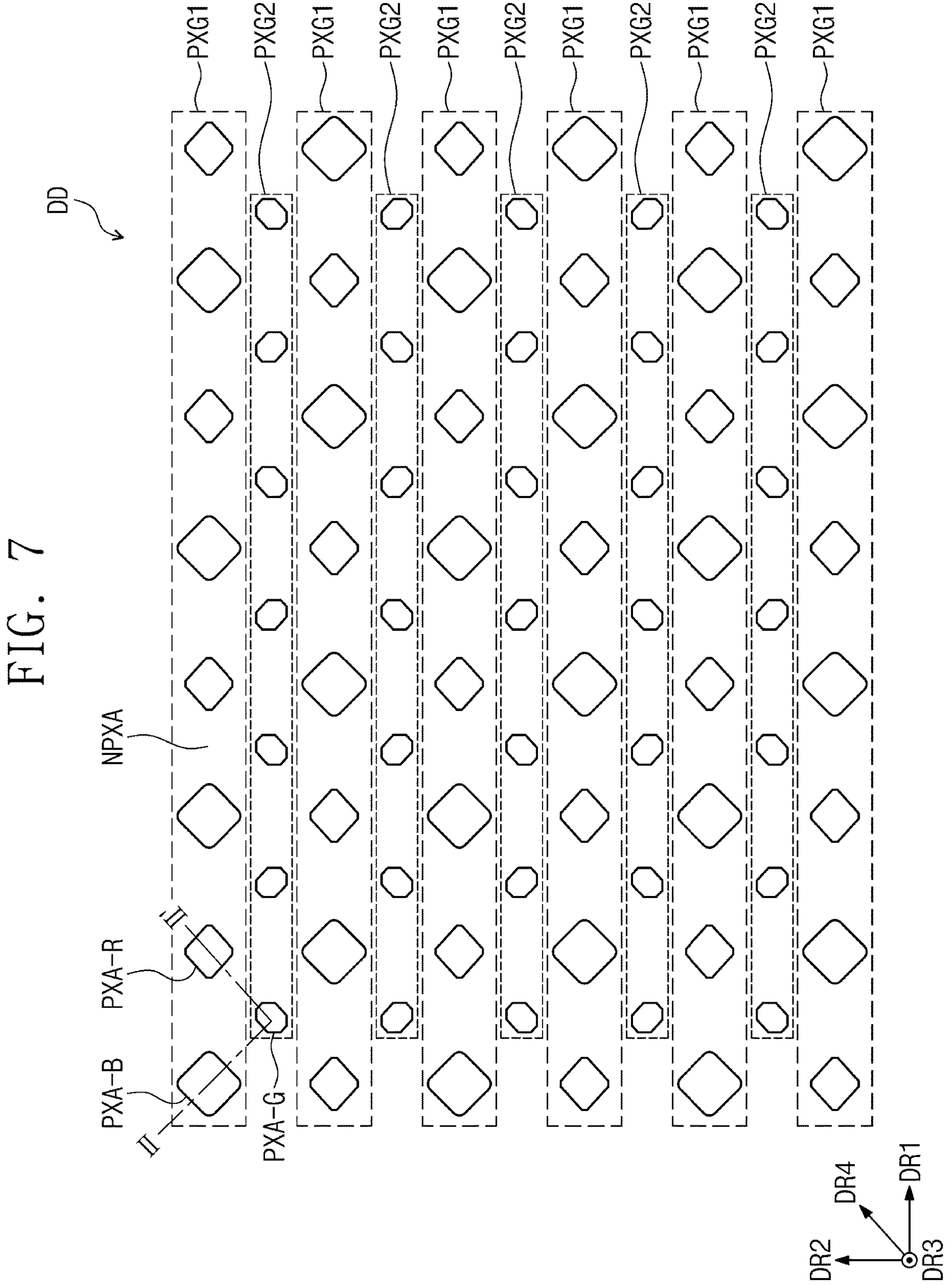
FIG. 7 is a schematic plan view of a display device according to an embodiment.

FIG. 7 is a schematic plan view of the display device DD according to an embodiment. FIG. 8 is a schematic cross-sectional view of the display device DD according to an embodiment, and corresponding to line II-II' of FIG. 7.

Referring to FIG. 7 and FIG. 8, the display device DD according to an embodiment may include light emitting elements ED-1, ED-2, and ED-3, wherein the light emitting elements ED-1, ED-2, and ED-3 may respectively include light emitting layers EL-B, EL-G, and EL-R respectively including quantum dots QD-C1, QD-C2, and QD-C3.

The display device DD according to an embodiment may include a display panel DP including light emitting elements ED-1, ED-2, and ED-3, and the light control layer PP disposed on the display panel DP. Although not shown in the drawings, in an embodiment, the light control layer PP may be omitted from the display device DD.

The display panel DP may include a base substrate BS, a circuit layer DP-CL provided on the base substrate BS, and a display element layer DP-EL, wherein the display element layer DP-EL may include a pixel definition film PDL, the light emitting elements ED-1, ED-2, and ED-3 disposed between the pixel definition films PDL, and an encapsulation layer TFE disposed on the light emitting elements ED-1, ED-2, and ED-3.

The display device DD may include a non-light emitting region NPXA and light emitting regions PXA-B, PXA-G, and PXA-R. Each of the light emitting regions PXA-B, PXA-G, and PXA-R may be a region in which light generated from each of the light emitting elements ED-1, ED-2, and ED-3 is emitted. The light emitting regions PXA-B, PXA-G, and PXA-R may be spaced apart from each other in a plan view.

The light emitting regions PXA-B, PXA-G, and PXA-R may be divided into groups according to the color of light generated in the light emitting elements ED-1, ED-2, and ED-3. In the display device DD according to an embodiment illustrated in FIG. 7 and FIG. 8, three light emitting regions PXA-B, PXA-G, and PXA-R which respectively emit blue light, green light, and red light are illustrated. For example, the display device DD according to an embodiment may include a blue light emitting region PXA-B, a green light emitting region PXA-G, and a red light emitting region PXA-R that are distinguished from each other.

The light emitting elements ED-1, ED-2, and ED-3 may each emit light having different wavelength regions. For example, in an embodiment, the display device DD may include a first light emitting device ED-1 which emits blue light, a second light emitting device ED-2 which emits green light, and a third light emitting device ED-3 which emits red light. However, embodiments are not limited thereto, and the first to third light emitting elements ED-1, ED-2, and ED-3 may emit light in a same wavelength region, or at least one thereof may emit light of a different wavelength region.

For example, the blue light emitting region PXA-B, the green light emitting region PXA-G, and the red light emitting region PXA-R of the display device DD may respectively correspond to the first light emitting element ED-1, the second light emitting element ED-2, and the third light emitting element ED-3.

A first light emitting layer EL-B of the first light emitting element ED-1 may include a first quantum dot QD-C1. The first quantum dot QD-C1 may emit blue light, which is a first color light. A second light emitting layer EL-G of the second light emitting element ED-2 and a third light emitting layer EL-R of the third light emitting element ED-3 may respectively include a second quantum dot QD-C2 and a third quantum dot QD-C3. The second quantum dot QD-C2 and the third quantum dot QD-C3 may respectively emit green light, which is a second color light, and red light, which is a third color light.

Each of the first to third quantum dots QD-C1, QD-C2, and QD-C3, may be a quantum dot QD-C as described herein with reference to the light emitting element and the quantum dot composition according to an embodiment.

In an embodiment, the first to third quantum dots QD-C1, QD-C2, and QD-C3 included in the light emitting elements ED-1, ED-2, and ED-3 may be formed of different core materials. In another embodiment, the first to third quantum dots QD-C1, QD-C2, and QD-C3 may be formed of a same core material, or two quantum dots selected from the first to third quantum dots QD-C1, QD-C2, and QD-C3 may be formed of a same core material and the remaining one may be formed of a different core material.

In an embodiment, the first to third quantum dots QD-C1, QD-C2, and QD-C3 may have different diameters from each other. For example, the first quantum dot QD-C1 used for the first light emitting element ED-1 which emits light of a relatively short-wavelength region may have a relatively small average diameter compared to the second quantum dot QD-C2 of the second light emitting element ED-2 and the third quantum dot QD-C3 of the third light emitting element ED-3 which emit light of a relatively long wavelength region. The second quantum dot QD-C2 may have a relatively small average diameter compared to the third quantum dot QD-C3. In the specification, the average diameter corresponds to an arithmetic average value of diameters of quantum dot particles. The diameter of a quantum dot particle may be an average value of widths of the quantum dot particle in a cross-section.

In the display device DD according to an embodiment illustrated in FIG. 7 and FIG. 8, the area of each of the light emitting regions PXA-B, PXA-G, and PXA-R may be different from each other. The area of each of the light emitting regions PXA-B, PXA-G, and PXA-R may be an area in a plan view that is defined by the first direction DR1 and the second direction DR2.

The light emitting regions PXA-B, PXA-G, and PXA-R may have different areas according to the color of light emitted from the light emitting layers EL-B, EL-G, and EL-R of the light emitting elements ED-1, ED-2, and ED-3. For example, referring to FIG. 7 and FIG. 8, in the display device DD according to an embodiment, the blue light emitting region PXA-B corresponding to the first light emitting element ED-1 emitting blue light may have the largest area, and the green light emitting area PXA-G corresponding to the second light emitting element ED-2 generating green light may have the smallest area. However, embodiments are not limited thereto. The light emitting regions PXA-B, PXA-G, and PXA-R may emit light of different colors other than blue light, green light, and red light, or the light emitting regions PXA-B, PXA-G, and PXA-R may have the same area. In another embodiment, the light emitting regions PXA-B, PXA-G, and PXA-R may be provided in an area ratio different from that illustrated in FIG. 7.

Each of the light emitting regions PXA-R, PXA-G, and PXA-B may be a region distinguished by the pixel definition film PDL. The non-light emitting regions NPXA may be regions between adjacent light emitting regions PXA-B, PXA-G, and PXA-R, and may be regions corresponding to the pixel definition film PDL. In the specification, each of the light emitting regions PXA-B, PXA-G, and PXA-R may correspond to a pixel. The pixel definition film PDL may separate the light emitting devices ED-1, ED-2, and ED-3. The light emitting layers EL-B, EL-G, and EL-R of the light emitting elements ED-1, ED-2, and ED-3 may be disposed in an opening OH defined in the pixel definition film PDL, and separated from each other.

The pixel definition film PDL may be formed of a polymer resin. For example, the pixel definition film PDL may include a polyacrylate-based resin or a polyimide-based resin. The pixel definition film PDL may further include an inorganic material, in addition to the polymer resin. The pixel definition film PDL may include a light absorbing material, or may include a black pigment or a black dye. A pixel definition film PDL that includes a black pigment or a black dye may be a black pixel definition film. When the pixel definition film PDL is formed, carbon black and the like may be used as a black pigment or a black dye, but embodiments are not limited thereto.

The pixel definition film PDL may be formed of an inorganic material. For example, the pixel definition film PDL may be formed by including silicon nitride (SiNx), silicon oxide (SiOx), silicon oxide (SiOxNy), or the like. The pixel definition film PDL may define the light emitting regions PXA-B, PXA-G, and PXA-R. The light emitting regions PXA-B, PXA-G, and PXA-R and the non-light emitting region NPXA may be distinguished by the pixel definition film PDL.

Each of the light emitting elements ED-1, ED-2, and ED-3 may include a first electrode EL1, a hole transport region HTR, light emitting layers EL-B, EL-G, EL-R, an electron transport region ETR, and a second electrode EL2. In the display device DD, a structure of the light emitting elements ED-1, ED-2, and ED-3 may be the same as a structure of a light emitting element ED as described in FIG. 4A or the same as a structure of a light emitting element ED-a as described in FIG. 4B, with respect to the first electrode EL1, the hole transport region HTR, the electron transport region ETR, and the second electrode EL2, except that the quantum dots QD-C1, QD-C2, and QD-C3 included in the light emitting layers EL-B, EL-G, and EL-R are different from each other.

The encapsulation layer TFE may cover the light emitting elements ED-1, ED-2, and ED-3. The encapsulation layer TFE may be a single layer or multiple layers. The encapsulation layer TFE may be a thin film encapsulation layer. The encapsulation layer TFE protects the light emitting elements ED-1, ED-2, and ED-3. The encapsulation layer TFE covers an upper surface of the second electrode EL2 disposed in the opening OH, and may fill the opening OH.

In FIG. 8, the hole transport region HTR and the electron transport region ETR are illustrated as being provided as a common layer while covering the pixel definition layer PDL, but embodiments are not limited thereto. In an embodiment, the hole transport region HTR and the electron transport region ETR may each be disposed in the opening OH defined on the pixel definition layer PDL.

For example, when not only the light emitting layers EL-B, EL-G, and EL-R but also the hole transport region HTR, the electron transport region ETR, and the like are provided by an inkjet printing method, the hole transport region HTR, the light emitting layers EL-B, EL-G, and EL-R, and the electron transport region ETR may be correspondingly provided to the opening OH defined between the pixel definition layers PDL. However, embodiments are not limited thereto, and regardless of the method of providing each functional layer, as illustrated in FIG. 8 and the like, the hole transport region HTR and the electron transport region ETR may not be patterned, but be provided as a common layer while covering the pixel definition layer PDL.

In the display device DD according to an embodiment illustrated in FIG. 8, thicknesses of the light emitting layers EL-B, EL-G, and EL-R of the first to third light emitting elements ED-1, ED-2, ED-3 are illustrated as all being similar, but embodiments are not limited thereto. For example, in an embodiment, the thicknesses of the light emitting layers EL-B, EL-G, and EL-R of the first to third light emitting elements ED-1, ED-2, ED-3 may be different from each other.

Referring to FIG. 7, the blue light emitting regions PXA-B and the red light emitting regions PXA-R may be alternately arranged along the first direction DR1 to form a first group PXG1. The green light emitting regions PXA-G may be arranged along the first direction DR1 to form a second group PXG2.

The first group PXG1 may be disposed spaced apart from the second group PXG2 along the second direction DR2. The first group PXG1 and the second group PXG2 may each be provided in a repeating pattern. The first groups PXG1 and the second groups PXG2 may be alternately arranged along the second direction DR2.

One green light emitting region PXA-G may be disposed spaced apart from one blue light emitting region PXA-B or one red light emitting region PXA-R in the fourth direction DR4. The fourth direction DR4 may be a direction between first direction DR1 and the second direction DR2.

The arrangement structure of the light emitting regions PXA-B, PXA-G, and PXA-R illustrated in FIG. 7 may be a pentile configuration (for example, a PENTILE® configuration). However, the arrangement structure of the light emitting regions PXA-B, PXA-G, and PXA-R in the display device DD according to an embodiment is not limited to the arrangement structure illustrated in FIG. 7. For example, in an embodiment, the light emitting regions PXA-B, PXA-G, and PXA-R may have a stripe configuration in which the blue light emitting region PXA-B, the green light emitting region PXA-G, and the red light emitting region PXA-R are sequentially and alternately arranged along the first direction DR1.

Referring to FIG. 3 and FIG. 8, the display device DD according to an embodiment may further include the light control layer PP. The light control layer PP may block external light provided to the display panel DP from the outside of the display device DD. The light control layer PP may block a portion of the external light. The light control layer PP may perform an anti-reflection function of minimizing reflection caused by the external light.

In an embodiment illustrated in FIG. 8, the light control layer PP may include a color filter layer CFL. For example, the display device DD according to an embodiment may further include the color filter layer CFL disposed on the light emitting elements ED-1, ED-2, and ED-3 of the display panel DP.

In the display device DD according to an embodiment, the light control layer PP may include a base layer BL and the color filter layer CFL.

The base layer BL may provide a base surface on which the color filter layer CFL and the like are disposed. The base layer BL may be a glass substrate, a metal substrate, a plastic substrate, and the like. However, embodiments are not limited thereto, and the base layer BL may include an inorganic layer, an organic layer, or a composite material layer.

The color filter layer CFL may include a light blocking member BM and a color filter unit CF. The color filter unit CF may include color filters CF-B, CF-G, and CF-R. For example, the color filter layer CFL may include a first color filter CF-B which transmits the first light, a second color filter CF-G which transmits the second light, and a third color filter CF-R which transmits the third light. For example, the first filter CF-B may be a blue filter, the second filter CF-G may be a green filter, and the third filter CF-R may be a red filter.

Each of the filters CF-B, CF-G, and CF-R may include a polymer photosensitive resin, and a pigment or a dye. The first filter CF-B may include a blue pigment or a blue dye, the second filter CF-G may include a green pigment or a green dye, and the third filter CF-R may include a red pigment or a red dye.

However, embodiments are not limited thereto, and the first filter CF-B may not include a pigment or a dye. The first filter CF-B may include a polymer photosensitive resin, but may not include a pigment or a dye. The first filter CF-B may be transparent. The first filter CF-B may be formed of a transparent photosensitive resin.

The light blocking member BM may be a black matrix. The light blocking member BM may include an organic light blocking material or an inorganic light blocking material which includes a black pigment or a black dye. The light blocking member BM may prevent a light leakage phenomenon, and may distinguish boundaries between adjacent filters CF-B, CF-G, and CF-R.

The color filter layer CFL may further include a buffer layer BFL. For example, the buffer layer BFL may be a protective layer for protecting the filters CF-B, CF-G, and CF-R. The buffer layer BFL may be an inorganic material layer including at least one inorganic material such as silicon nitride, silicon oxide, or silicon oxynitride. The buffer layer BFL may be formed of a single layer or multiple layers.

In an embodiment illustrated in FIG. 8, it is shown that the first filter CF-B of the color filter layer CFL overlaps the second filter CF-G and the third filter CF-R, but embodiments are not limited thereto. For example, the first to third filters CF-B, CF-G, and CF-R may be distinguished by the light blocking member BM, and may not overlap each other. In an embodiment, the first to third filters CF-B, CF-G, and CF-R may be disposed to respectively correspond to the blue light emitting region PXA-B, the green light emitting region PXA-G, and the red light emitting region PXA-R.

Although not illustrated in FIG. 8, the display device DD according to an embodiment may include a polarizing layer (not shown) instead of the color filter layer CFL as the light control layer PP. The polarizing layer (not shown) may block external light provided to the display panel DP from the outside. The polarizing layer (not shown) may block a portion of the external light.

The polarizing layer (not shown) may reduce light that is reflected at the display panel DP from an external light. For example, the polarizing layer (not shown) may block reflected light which is generated when light provided from outside of the display device DD is incident on the display panel DP and emitted. The polarizing layer (not shown) may be a circular polarizer having an anti-reflection function or the polarizing layer (not shown) may include a linear polarizer and a $\lambda/4$ phase retarder. The polarizing layer (not shown) may be disposed on the base layer BL, or the polarizing layer (not shown) may be disposed in a lower portion of the base layer BL.

Hereinafter, a method for manufacturing a light emitting element according to an embodiment will be described. Structural properties of the light emitting element described with reference to FIG. 1 to FIG. 8 will not be described again, but features of the manufacturing method will be described in detail.

Figure 9A:
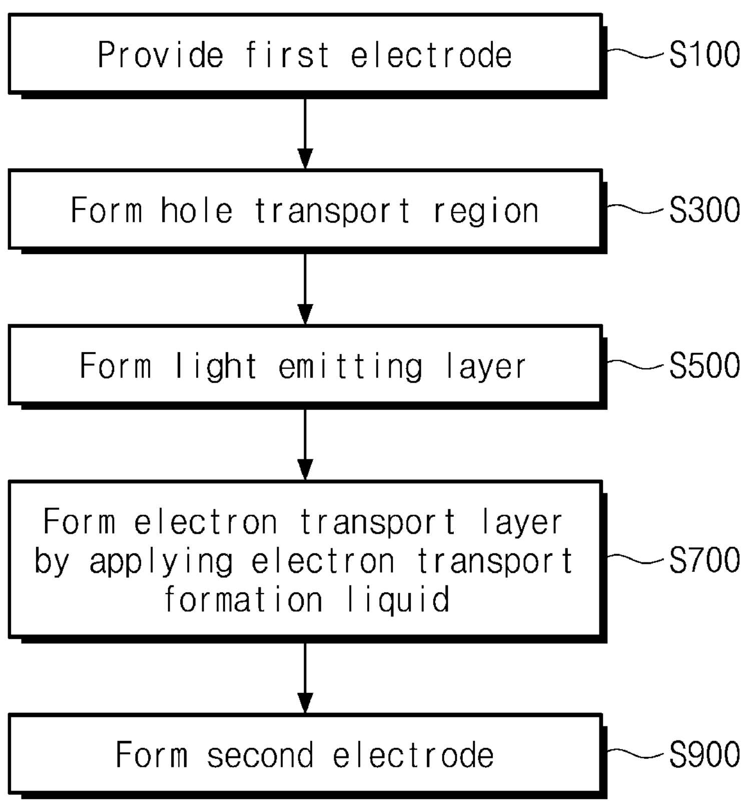
FIG. 9A is a flowchart showing a method for manufacturing a light emitting element according to an embodiment.
Figure 9B:
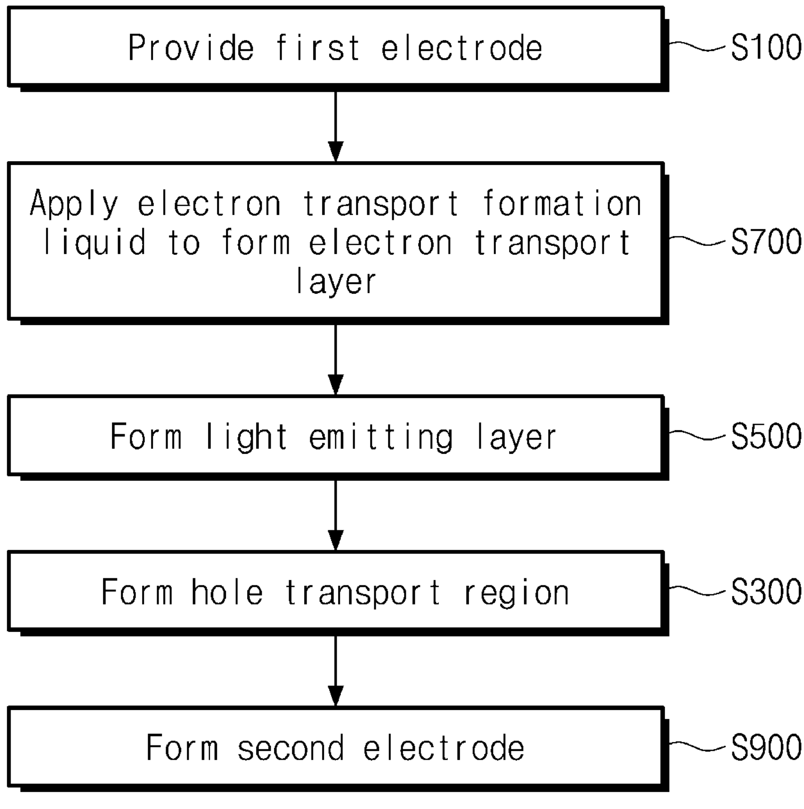
FIG. 9B is a flowchart showing a method for manufacturing a light emitting element according to an embodiment.

FIG. 9A is a flowchart showing a method for manufacturing a light emitting element according to an embodiment. FIG. 9B is a flowchart showing a method for manufacturing a light emitting element according to an embodiment. Referring to FIG. 9A, the method for manufacturing a light emitting element according to an embodiment may include providing a first electrode S100, forming a hole transport region S300, forming a light emitting layer S500, applying an electron transport formation liquid to form an electron transport layer S700, and forming a second electrode S900. The forming of the electron transport layer ETL (see FIG. 4A) may include forming the electron transport layer ETL (see FIG. 4A) directly on the light emitting layer EL (see FIG. 4A). Referring to FIG. 9B, the method for manufacturing a light emitting element according to an embodiment may include providing a first electrode S100, applying an electron transport formation liquid to form an electron transport layer S700, forming a light emitting layer S500, forming a hole transport region S300, and forming a second electrode S900.

Figure 10:
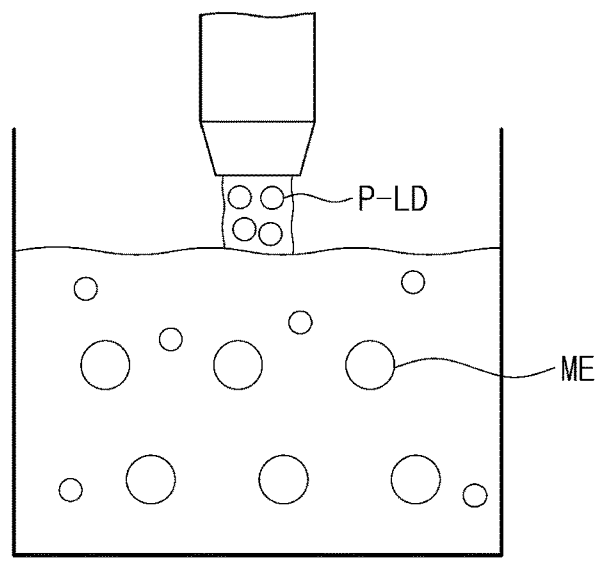
FIG. 10 is a schematic view of a process of preparing an electron transport formation liquid according to an embodiment.
Figure 11:
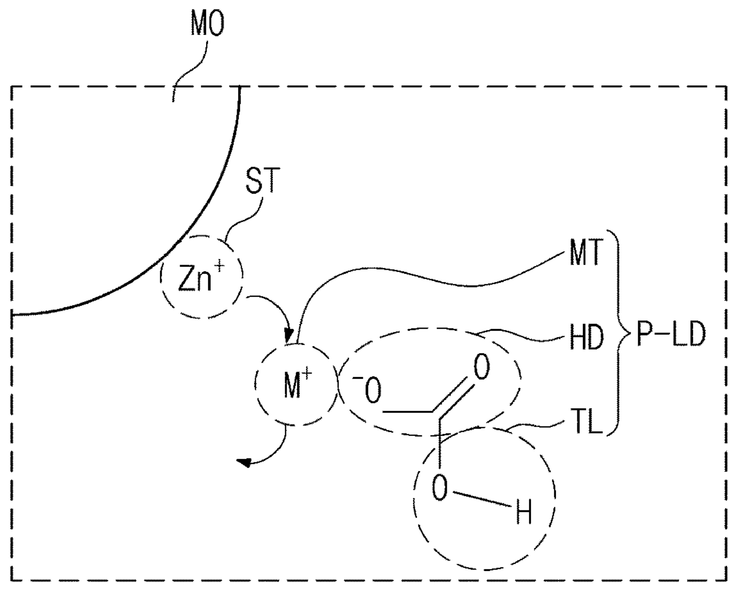
FIG. 11 is a schematic view of an enlarged electron transport formation liquid according to an embodiment.

Hereinafter, the method for manufacturing a light emitting element illustrated in FIG. 9A will be described. The same contents as those described with reference to FIG. 9A may be applied to the method for manufacturing a light emitting device illustrated in FIG. 9B, except that steps of the forming of the electron transport layer S700 and the forming of the hole transport region S300 are reversed. FIG. 10 is a schematic view of a process of preparing an electron transport formation liquid according to an embodiment. FIG. 11 is a schematic view of an enlarged electron transport formation liquid according to an embodiment. For example, the electron transport formation liquids of FIG. 10 and FIG. 11 may be similar to the electron transport formation liquid of the forming of the electron transport layer S700 (see FIG. 9).

Referring to FIG. 10 and FIG. 11, preparing the electron transport formation solution may include adding a solution containing an organic metal oxide P-LD to a solution containing a metal oxide particle ME. The same description of the metal oxide particle ME shown in FIG. 5 may be applied to the metal oxide particle ME.

The organic metal oxide P-LD may include a metal cation MT at an end of a head portion HD. For example, the organic metal oxide P-LD may have the metal cation MT coupled to an oxygen anion of the head portion HD.

When the coupling of the head portion HD and the metal cation MT is dissociated, the organic metal oxide P-LD may be coupled to a coupling portion ST of the metal oxide particle ME. In FIG. 11, the coupling portion ST is illustrated as being $Zn^{+}$, but embodiments are not limited thereto. For example, the coupling portion ST may be a metal ion Met. The metal Me may include at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba. As a result, the electron transport material ETM illustrated in FIG. 5 may be formed.

Hereinafter, the light emitting element according to an embodiment will be described in detail with reference to Examples and Comparative Examples. The Examples shown below are for illustrative purposes only to facilitate the understanding of the embodiments, and thus, the scope of the disclosure is not limited thereto.

Figure 12:
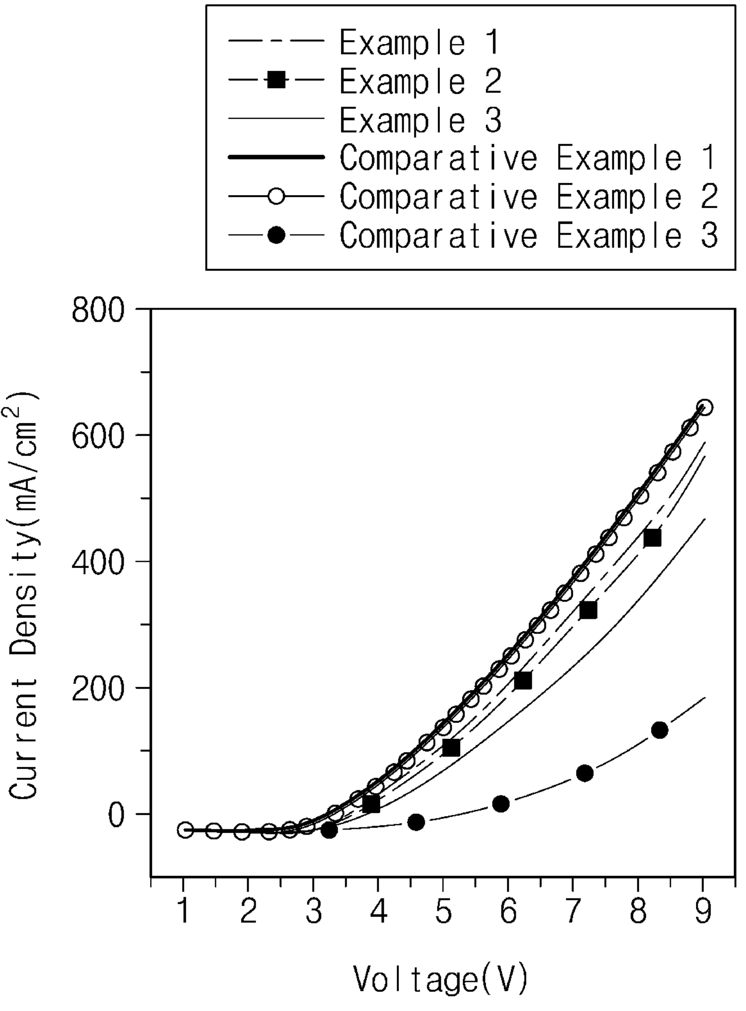
FIG. 12 is a graph showing a change in current density according to a change in the voltage of a light emitting element according to Examples and Comparative Examples.
Figure 13:
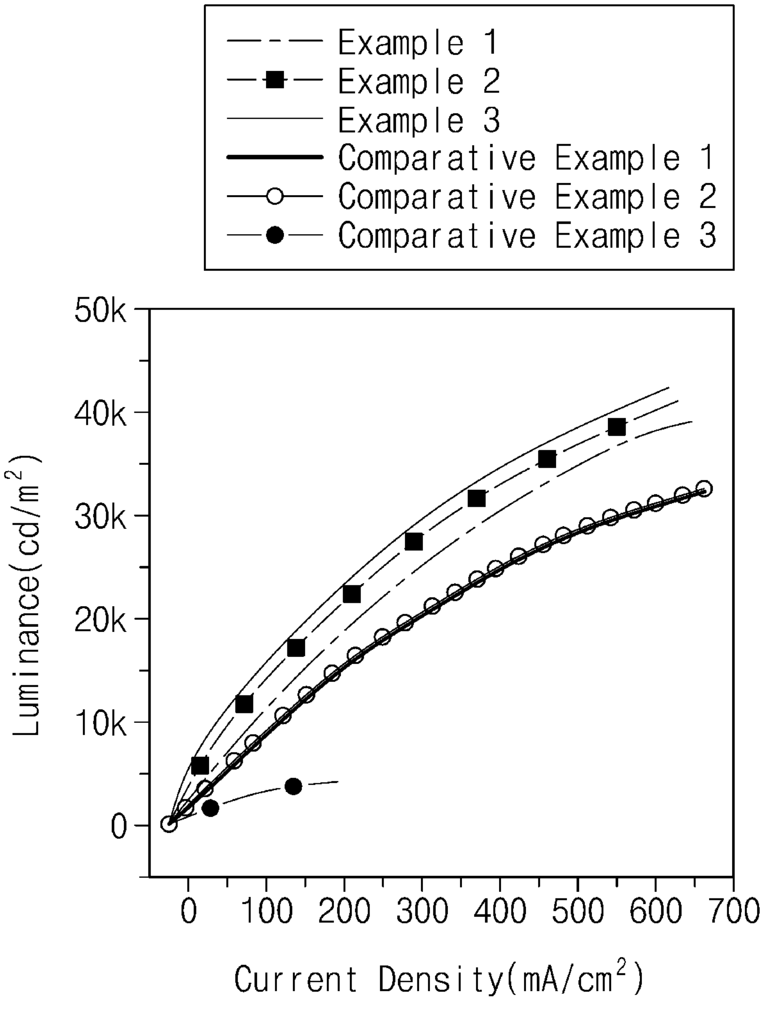
FIG. 13 is a graph showing a change in luminance according to a change in the current density of a light emitting element according to Examples and Comparative Examples.
Figure 14:
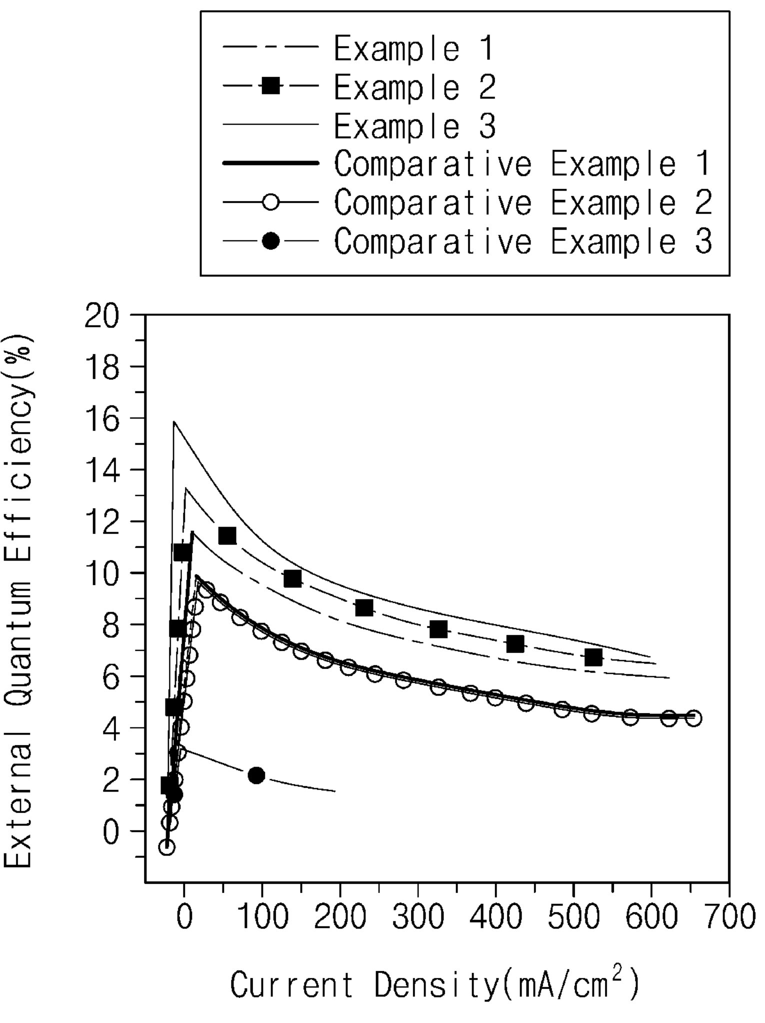
FIG. 14 is a graph showing a change in maximum quantum efficiency according to a change in the current density of a light emitting element according to Examples and Comparative Examples.

FIG. 12 is a graph showing a change in current density according to the voltage of a light emitting element according to Examples and Comparative Examples. FIG. 13 is a graph showing a change in luminance according to the current density of a light emitting element according to Examples and Comparative Examples. FIG. 14 is a graph showing a change in maximum quantum efficiency according to the current density of a light emitting element according to Examples and Comparative Examples.

In FIG. 12 to FIG. 14, Comparative Example 1 is a light emitting element including an electron transport material not containing metal nanoparticles in an electron transport layer. Comparative Example 2 is a light emitting element including 5 mol % of metal nanoparticles based on metal oxide particles included in an electron transport layer. Example 1 is a light emitting element including 10 mol % of metal nanoparticles based on metal oxide particles included in an electron transport layer. Example 2 is a light emitting element including 15 mol % of metal nanoparticles based on metal oxide particles included in an electron transport layer. Example 3 is a light emitting element including 20 mol % of metal nanoparticles based on metal oxide particles included in an electron transport layer. Comparative Example 3 is a light emitting element including 25 mol % of metal nanoparticles based on metal oxide particles included in an electron transport layer.

(Manufacturing of Light Emitting Device)

A glass substrate patterned with ITO of 15 $\Omega/cm^2$ (1000 Å) was cut to a size of 50 mm×50 mm×0.7 mm, and ultrasonically cleaned for 5 minutes each using isopropyl alcohol and pure water, and irradiated with ultraviolet rays for 30 minutes and exposed to ozone to be cleaned.

Poly(ethylenedioxythiophene):polystyrenesulfonate (PEDOT:PSS) was deposited to a thickness of 400 Å, and poly[(9,9-dioctylfluorenyl-2,7-diyl)-co-(4,4'-(N-(4-sec-butylphenyl))diphenylamine)] (TFB) was deposited to a thickness of 250 Å to form a hole transport region. ZnSeTe/ZnSe/ZnS quantum dots were deposited in an upper portion of the hole transport region to form a light emitting layer having a thickness of about 250 Å. The electron transport material used in Example 1, Example 2, Comparative Example 1, and Comparative Example 2 was deposited to a thickness of 200 Å in an upper portion of the light emitting layer to form an electron transport layer. Al was deposited in an upper portion of the electron transport layer to provide a second electrode having a thickness of 1000 Å, thereby manufacturing a light emitting element.

Referring to FIG. 12, the light emitting elements of Example 1 to Example 3 have lower current density than the light emitting elements of Comparative Example 1 and Comparative Example 2 under the same voltage conditions. From the above, it can be seen that as the content of the metal nanoparticles in the electron transport layer increases based on the metal oxide particles, the current density according to the voltage of a light emitting element decreases. The light emitting element of Comparative Example 3 has lower current density than the light emitting elements of Examples under the same voltage conditions. From the above, it can be seen that when an electron transport layer includes equal to or less than 20 mol % of metal nanoparticles based on metal oxide particles, the current density according to the voltage of a light emitting element is high.

Referring to FIG. 13, it can be confirmed that the light emitting elements of Example 1 to Example 3 exhibit higher luminance than the light emitting elements of Comparative Example 1 and Comparative Example 2 under the same current density conditions. It may be seen that the light emitting elements of Example 1 to Example 3 have a higher current efficiency than those of Comparative Example 1 and Comparative Example 2. From the above, it can be seen that when an electron transport layer includes equal to or greater than 10 mol % of metal nanoparticles based on metal oxide particles, the current efficiency of a light emitting element is high. The light emitting element of Comparative Example 3 has lower luminance than the light emitting elements of Examples under the same current density conditions. From the above, it can be seen that when an electron transport layer includes equal to or less than 20 mol % of metal nanoparticles based on metal oxide particles, the current efficiency of a light emitting element is high.

Referring to FIG. 14, when compared to the light emitting elements of Comparative Example 1 and Comparative Example 2, it can be confirmed that the light emitting elements of Example 1 to Example 3 have excellent quantum efficiency under the same current density conditions. From the above, it can be confirmed that when an electron transport layer induces an electron transport material containing equal to or greater than 10 mol % of nanoparticles, a light emitting element has excellent external quantum efficiency. The light emitting element of Comparative Example 3 has lower external quantum efficiency than the light emitting elements of Examples under the same current density conditions. From the above, it can be seen that when an electron transport layer includes equal to or less than 20 mol % of metal nanoparticles based on metal oxide particles, the external quantum efficiency of a light emitting element is excellent.

A light emitting element of an embodiment and a display device including the light emitting element may include an electron transport layer including metal oxide particles coupled with a bicarbonate on the surfaces thereof. Accordingly, the number of holes transmitted from a hole transport region including an organic material to a light emitting layer and the number of electrons transmitted from the electron transport layer including an inorganic material to the light emitting layer may be maintained in an appropriate ratio. As a result, the light emitting element according to an embodiment and the display device including the light emitting element may have excellent light emitting efficiency.

A method for manufacturing a light emitting element according to an embodiment may include applying a metallic compound containing a bicarbonate and an electron transport formation liquid containing metal oxide particles on a light emitting layer to form an electron transport layer. As a result, the electron transport layer including metal oxide particles coupled with a bicarbonate on the surfaces thereof is included to provide a light emitting element having excellent light emitting efficiency.

A light emitting element according to an embodiment, and a display device including the same include an electron transport layer including a metal oxide particle coupled with a bicarbonate, and thus may have excellent light emitting efficiency.

A method for manufacturing a light emitting element according to another embodiment includes forming an electron transport layer with an electron transport material including a metal oxide particle coupled with a bicarbonate, and thus may provide a light emitting element having excellent light emitting efficiency.

Embodiments have been disclosed herein, and although terms are employed, they are used and are to be interpreted in a generic and descriptive sense only and not for the purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A light emitting element comprising:
a first electrode;
a second electrode disposed on the first electrode;
a light emitting layer disposed between the first electrode and the second electrode, and including a quantum dot;
a hole transport region disposed between the first electrode and the light emitting layer; and
an electron transport layer disposed between the light emitting layer and the second electrode, wherein
the electron transport layer includes an electron transport material, and
the electron transport material includes:
a metal oxide particle; and
a bicarbonate coupled to a surface of the metal oxide particle,
wherein the electron transport material comprises about 10 mol % to about 20 mol % of the bicarbonate, based on a total number of moles of the metal oxide particle.

2. The light emitting element of claim 1, wherein the metal oxide particle is represented by Formula 1:

$$Zn_{(1-x)}Me_xO \quad \text{[Formula 1]}$$

wherein in Formula 1,
$0 \leq x \leq 0.5$, and
Me includes at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba.

3. The light emitting element of claim 1, wherein the electron transport layer is directly disposed on the light emitting layer.

4. The light emitting element of claim 1, wherein the quantum dot does not comprise cadmium.

5. The light emitting element of claim 1, wherein the hole transport region comprises:
a hole injection layer; and
a hole transport layer disposed between the hole injection layer and the light emitting layer.

6. A display device comprising a plurality of light emitting elements, wherein each of the light emitting elements includes:
a first electrode;
a second electrode disposed on the first electrode;
a light emitting layer disposed between the first electrode and the second electrode, and including a quantum dot;
a hole transport region disposed between the first electrode and the light emitting layer; and
an electron transport layer disposed between the light emitting layer and the second electrode, wherein
the electron transport layer includes an electron transport material, and
the electron transport material includes:
a metal oxide particle; and
a bicarbonate coupled to a surface of the metal oxide particle,
wherein the electron transport material comprises about 10 mol % to about 20 mol % of the bicarbonate, based on a total number of moles of the metal oxide particle.

7. A display device comprising a plurality of light emitting elements, wherein each of the light emitting elements includes:
a first electrode;
a second electrode disposed on the first electrode;
a light emitting layer disposed between the first electrode and the second electrode, and including a quantum dot;
a hole transport region disposed between the first electrode and the light emitting layer; and
an electron transport layer disposed between the light emitting layer and the second electrode, wherein
the electron transport layer includes an electron transport material, and
the electron transport material includes:
a metal oxide particle; and a bicarbonate coupled to a surface of the metal oxide particle, wherein the quantum dot comprises:

a first quantum dot emitting first color light;

a second quantum dot emitting second color light which has a wavelength longer than that of the first color light; and a third quantum dot emitting third color light which has a wavelength longer than that of the second color light, and the light emitting elements comprise:

a first light emitting element including the first quantum dot;

a second light emitting element including the second quantum dot; and a third light emitting element including the third quantum dot.

8. The display device of claim 7, wherein the average diameter of the first to third quantum dots satisfies Equation 1:

average diameter of first quantum dot<average diameter of second quantum dot<average diameter of third quantum dot. [Equation 1]

9. The display device of claim 7, wherein the hole transport region comprises:

a hole injection layer; and a hole transport layer disposed between the hole injection layer and the light emitting layer.

10. The display device of claim 6, wherein the metal oxide particle is represented by Formula 1:

$$Zn_{(1-x)}Me_xO$$ [Formula 1]

wherein in Formula 1, $0 \leq x \leq 0.5$, and

Me includes at least one of Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, and Ba.

11. The display device of claim 6, wherein the electron transport layer is directly disposed on the light emitting layer.

12. The display device of claim 6, wherein the quantum dot does not comprise cadmium.

* * * * *